United States Patent
Wong

[11] Patent Number: 6,027,999
[45] Date of Patent: Feb. 22, 2000

[54] PAD DEFINITION TO ACHIEVE HIGHLY REFLECTIVE PLATE WITHOUT AFFECTING BONDABILITY

[75] Inventor: George Wong, Singapore, Singapore

[73] Assignee: Chartered Semiconductor Manufacturing, Ltd., Singapore, Singapore

[21] Appl. No.: 09/151,159

[22] Filed: Sep. 10, 1998

[51] Int. Cl.[7] .............................................. H01L 21/4763
[52] U.S. Cl. ......................... 438/637; 438/612; 438/617; 438/618; 257/737
[58] Field of Search ................................... 438/612, 613, 438/617, 637, 618; 228/180.5; 257/737, 738

[56] References Cited

U.S. PATENT DOCUMENTS

| | | | |
|---|---|---|---|
| 5,056,895 | 10/1991 | Kahn | 359/87 |
| 5,537,234 | 7/1996 | Williams et al. | 359/59 |
| 5,591,480 | 1/1997 | Weisman et al. | 216/13 |
| 5,705,424 | 1/1998 | Zavracky et al. | 437/86 |

*Primary Examiner*—Olik Chaudhuri
*Assistant Examiner*—Ginette Peralta
*Attorney, Agent, or Firm*—George O. Saile; Rosemary L.S. Pike

[57] ABSTRACT

A process for fabricating pixels and bonding pads wherein each has an optimal metal thickness in the fabrication of a LCD integrated circuit device is achieved. Semiconductor device structures are formed in and on a semiconductor substrate wherein the semiconductor device structures are covered by an insulating layer. A first metal layer is deposited overlying the insulating layer and patterned to form a metal line and a bonding pad. A dielectric layer is deposited overlying the metal line and the bonding pad. Vias are opened through the dielectric layer to the metal line but not to the bonding pad. A second metal layer is deposited overlying the dielectric layer and filling the via openings and etched back to form metal plugs. A third metal layer is deposited overlying the dielectric layer and metal plugs and patterned to form pixels contacting metal plugs. A passivation layer is deposited overlying the pixels. A via opening is etched through the passivation layer and the dielectric layer to the bonding pad. A wire bond is formed within the via opening to contact the bonding pad to complete the fabrication of the integrated circuit device.

21 Claims, 4 Drawing Sheets

PAD DEFINITION TO ACHIEVE HIGHLY REFLECTIVE PLATE WITHOUT AFFECTING BONDABILITY

BACKGROUND OF THE INVENTION (1) Field of the Invention

The present invention relates to the fabrication of LCD integrated circuit devices, and more particularly, to a method of bonding pad definition which allows for the formation of a highly reflective pixel plate in the fabrication of LCD integrated circuit devices.

(2) Description of the Prior Art

Liquid crystal displays (LCD) have been used in the art for such applications as computer and television screens. Typically, the topmost level fabricated on a bottom substrate is a series of metal pixels, 19×19 microns in area. There are typically 1024×768 pixels having a spacing of 0.7 microns between each pixel. The liquid crystal display layer is built on this array of metal pixels and enclosed by a top substrate comprising a transparent material.

FIG. 1 illustrates a LCD integrated circuit device of the prior art. Bottom semiconductor substrate 10 is illustrated. Gate electrodes and source and drain regions having connections to a first metal layer would be formed in and on the semiconductor substrate. Only the second metal layer 22 and above are shown in this illustration. Second metal lines 22 are formed on the surface of the substrate. An insulating layer 26 is deposited over the metal lines. Tungsten plugs 28 are formed within openings through the insulating layer to the metal lines 22. A third level of metal lines 32, usually an aluminum alloy, are formed overlying a barrier layer 30, typically titanium nitride. The barrier layer typically has a thickness of about 1000 Angstroms and the metal lines 32 have a thickness of about 5000 Angstroms. The aluminum alloy is separated and protected by a passivation layer, typically 1000 Angstroms of undoped silicate glass (USG) 34 followed by 2500 Angstroms of silicon nitride 36. The liquid crystal material 52 lies between the passivation layer and the top substrate 56. Sometimes the pixel formation is in a fourth metal layer rather than the third metal layer.

Since the reflective metal lines 32 forming the pixels are at the same level as the bonding pad, not shown, the thickness of the metal layer is typically the thickness required for good bondability; i.e. about 5000 Angstroms. However, a very thin aluminum layer is preferred for maximum reflectivity of the pixels, about 1000 to 2000 Angstroms. Another issue in forming the pixels and bonding pad simultaneously is that the bonding pad via opening is typically much larger than the via openings for the pixels. The tungsten plug process requires via openings to be close to equal in size. Otherwise, tungsten residue in the large opening will result in poor metal adhesion.

The deep trenches 60 between the pixels caused by the thick aluminum layer 32 cause the LCD material to become trapped between the pixels. Due to the sequencing effect required for image formation, the pixels will have differential voltages. If two adjacent pixels have slightly different voltages, the LCD material trapped between them may light up undesirably. This is termed "cross-talk."

There are a number of patents in the field of LCD's. For example, U.S. Pat. Nos. 5,537,234 to Williams et al, 5,705,424 to Zavracky et al, and 5,056,895 to Kahn teach various LCD fabrication techniques. U.S. Pat. No. 5,591,480 to Weisman et al teaches a method of forming a metal pattern having multiple metal thicknesses and composition. However, none of these patents address the issue of bonding pad thickness versus optimal pixel thickness.

SUMMARY OF THE INVENTION

Accordingly, a primary object of the invention is to provide a process for fabricating pixels and bonding pads wherein each has an optimal metal thickness in the fabrication of a LCD integrated circuit device.

A further object of the invention is to provide a process for fabricating pixels comprising thin highly reflective plates in the fabrication of a LCD integrated circuit device.

Another object is to provide a process for fabricating bonding pads having a sufficient thickness for good bondability in the fabrication of a LCD integrated circuit device.

Yet another object of the invention is to provide a process for fabricating pixels comprising thin highly reflective plates wherein pixel cross-talk is eliminated in the fabrication of a LCD integrated circuit device.

In accordance with the objects of the invention, a process for fabricating pixels and bonding pads wherein each has an optimal metal thickness in the fabrication of a LCD integrated circuit device is achieved. Semiconductor device structures are formed in and on a semiconductor substrate wherein the semiconductor device structures are covered by an insulating layer. A first metal layer is deposited overlying the insulating layer and patterned to form a metal line and a bonding pad. A dielectric layer is deposited overlying the metal line and the bonding pad. Vias are opened through the dielectric layer to the metal line but not to the bonding pad. A second metal layer is deposited overlying the dielectric layer and filling the via openings and etched back to form metal plugs. A third metal layer is deposited overlying the dielectric layer and metal plugs and patterned to form pixels contacting metal plugs. A passivation layer is deposited overlying the pixels. A via opening is etched through the passivation layer and the dielectric layer to the bonding pad. A wire bond is formed within the via opening to contact the bonding pad to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
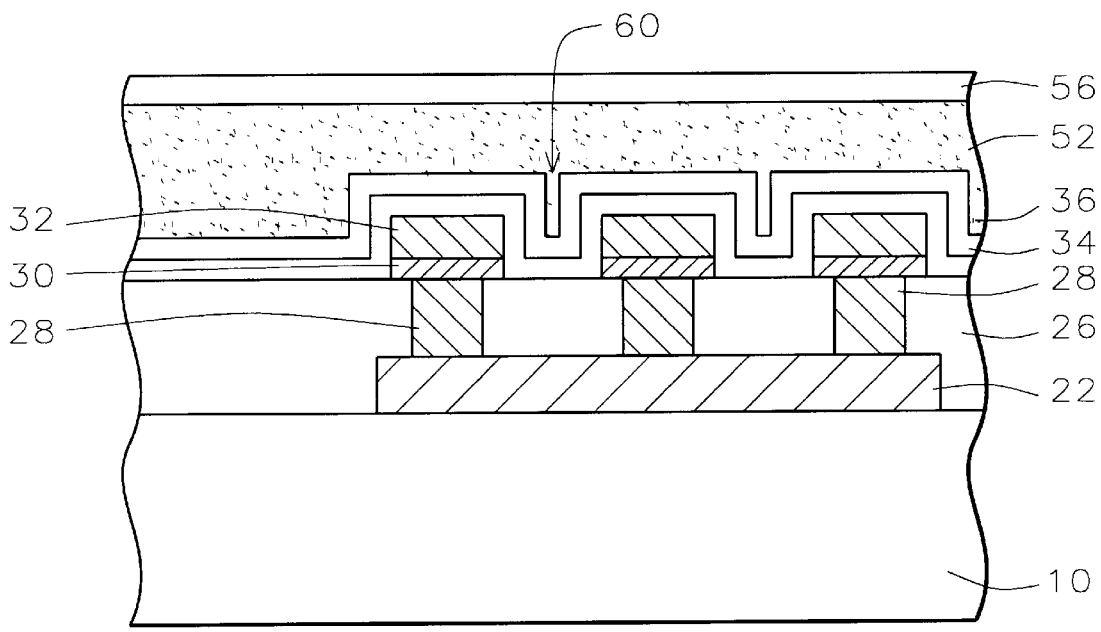
FIG. 1 is a cross-sectional representation of an LCD device of the prior art.
Figure 2:
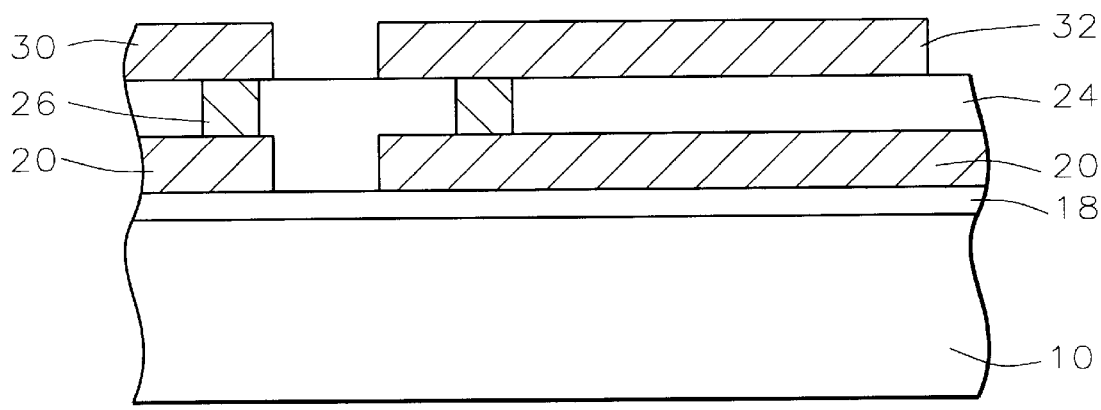
FIGS. 2–6 are cross-sectional representations of a preferred embodiment of the present invention.

Referring now more particularly to FIG. 2, there is shown a semiconductor substrate 10, preferably composed of monocrystalline silicon. Semiconductor device structures which may include polysilicon gate electrodes and source and drain regions, not shown, are formed in and on the semiconductor substrate and covered with an insulating layer 18.

In the process of the present invention, the bonding pad is to be defined at the metal level below the reflective level. For example, a layer of conducting material, such as aluminum or an aluminum alloy, is deposited over a barrier/glue layer, not shown, and patterned to form first metal lines 20. Intermetal dielectric layer 24 covers the metal lines 20. Vias are opened through the dielectric layer 24 and filled, for example, by a tungsten plug process. A second metal layer is deposited and patterned to form metal lines 30 and 32, where line 30 will be a bonding pad.

Figure 3:
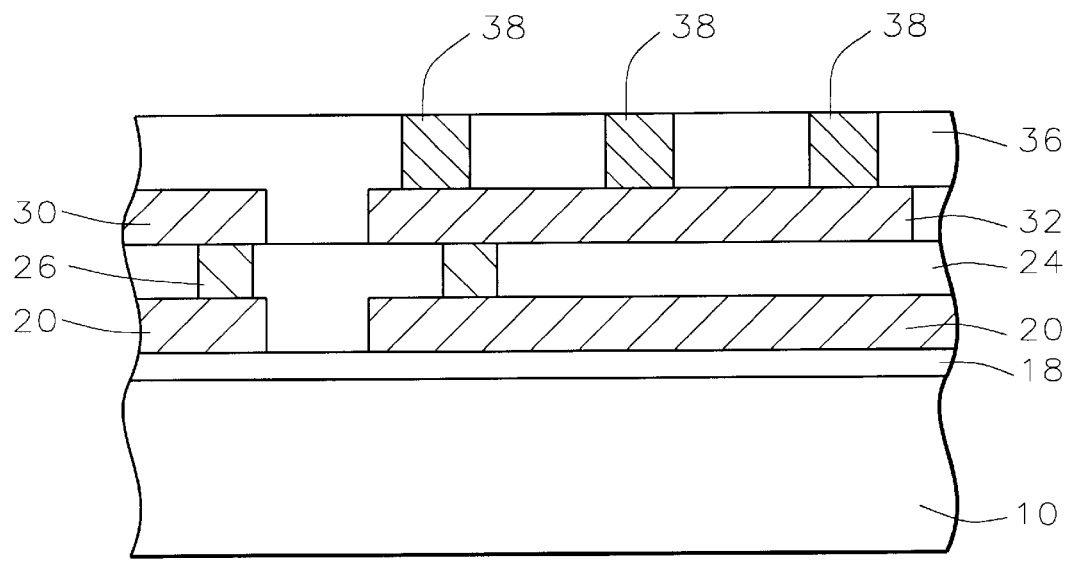

An insulating layer 36, such as tetraethoxysilane (TEOS) oxide, plasma enhanced chemically vapor deposited (PECVD) oxide, high density plasma (HDP) oxide, or the like, is deposited over the metal lines, as shown in FIG. 3. Via openings are etched through the insulating layer 36 to the metal line 32. No via is opened over the bonding pad 30. A tungsten layer is deposited over the insulating layer and within the via openings and then etched back to form tungsten plugs 38.

Pixel use is for optical reflection more than for carrying current. However, if designers incorporate a small amount of interconnect routing at this level, a barrier metal layer would be required under the pixel metal layer. As this is an option, it will not be illustrated or discussed further.

Figure 4:
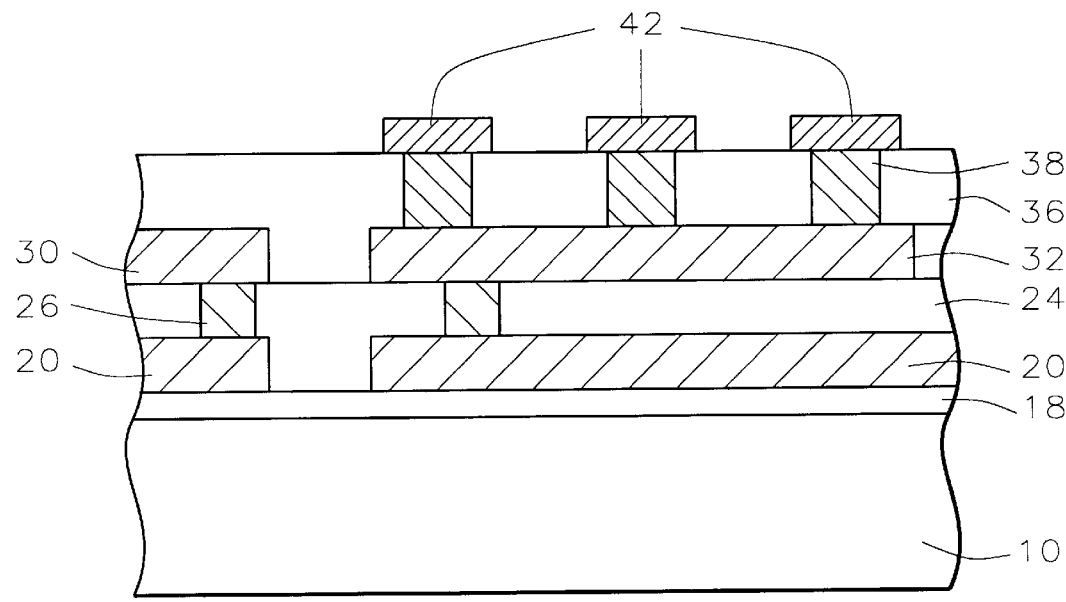
Figure 5:
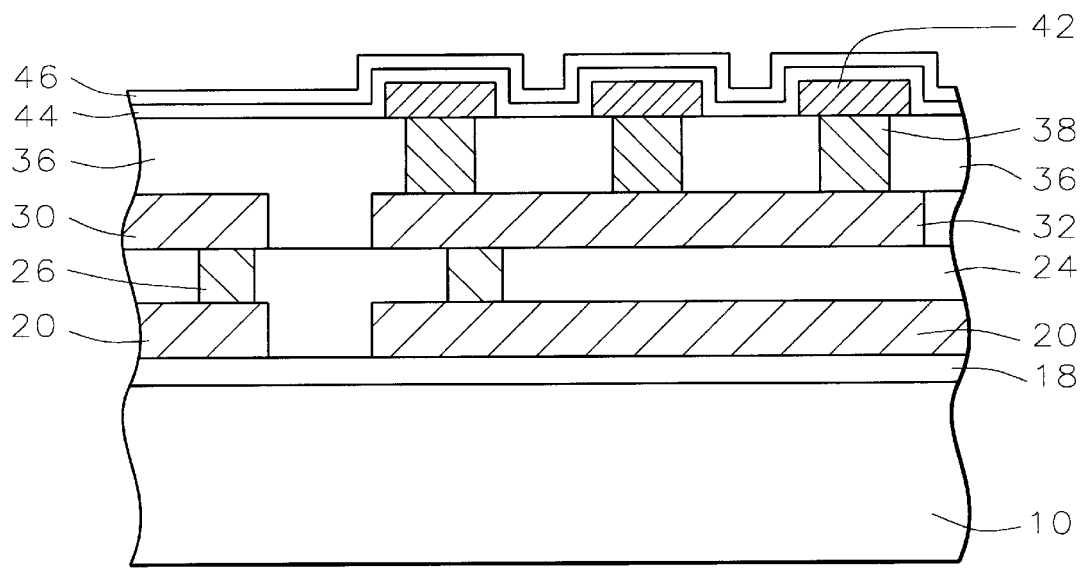

A thin pixel metal layer is deposited over the insulating layer and tungsten plugs, 36 and 38, respectively. The metal layer is typically aluminum or an aluminum alloy and has a thickness of between about 1000 and 2000 Angstroms. The metal layer is patterned to form the metal pixels 42, as shown in FIG. 4.

The passivation layer is formed as is conventional in the art. For example, undoped silicate glass (USG) 44 is deposited over the metal pixels 42 to a thickness of between about 500 and 1000 Angstroms. A silicon nitride layer 46 is deposited over the USG layer to a thickness of 500 and 1000 Angstroms.

The thin metal 42 allows for a reduced passivation aspect ratio between pixels which reduces pixel cross-talk.

Figure 6:
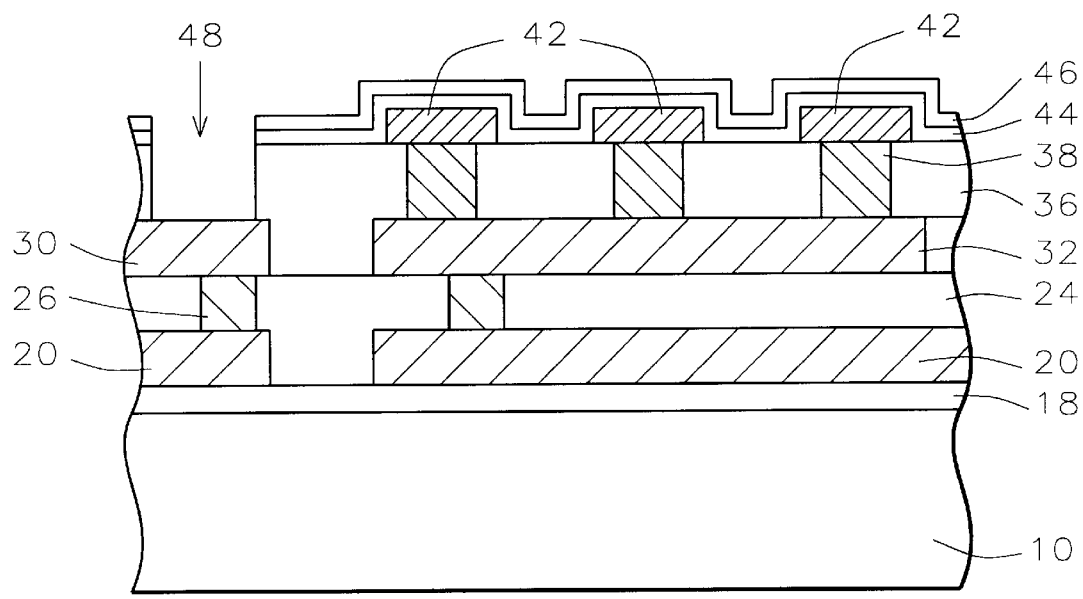

After the passivation stack has been deposited, a via 48 is opened to the bonding pad 20, as illustrated in FIG. 6.

Figure 7:
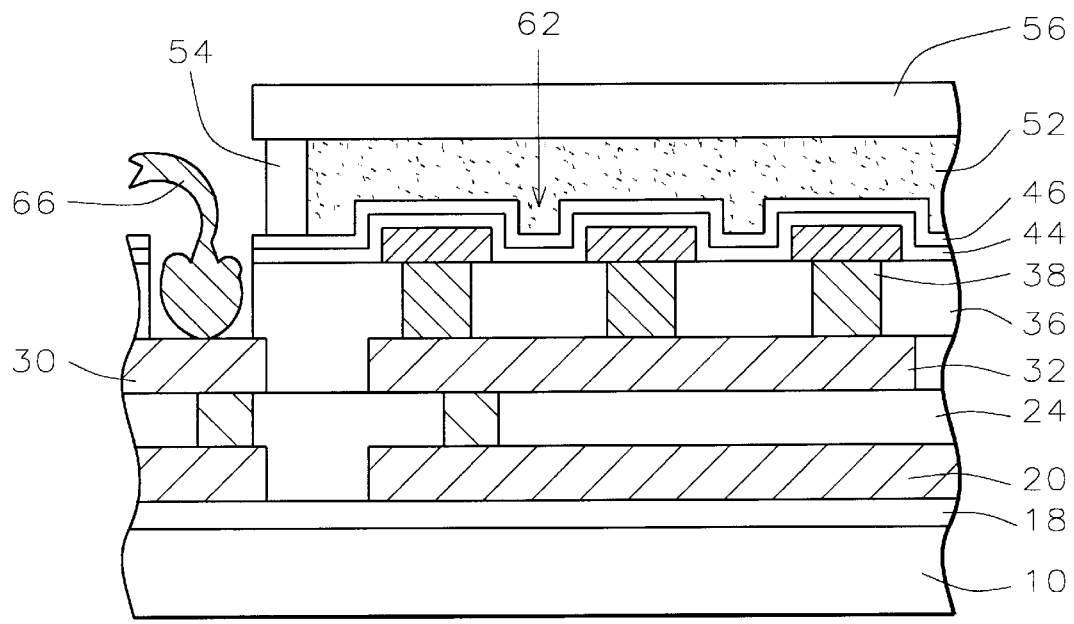
FIGS. 7 and 8 are cross-sectional representations of a completed LCD integrated circuit device fabricated according to the process of the present invention.

FIG. 7 shows a completed LCD device in which the liquid crystal material 52 fills the gap between the pixels 42 and the top substrate 56. 54 is an LCD standoff. Because of the thin metal pixels 42, the aspect ratio of the gap 62 between the pixels is small enough that pixel cross-talk is eliminated. In the bonding pad area, a wire bond 66 is fabricated to make contact to a printed circuit board, not shown. The aluminum layer 66 has a thickness of between about 5000 to 6000 Angstroms over the bonding pad. Thus, the wire bond can have sufficient thickness for good bondability while the pixels can be sufficiently thin to maximize reflectivity.

Figure 8:
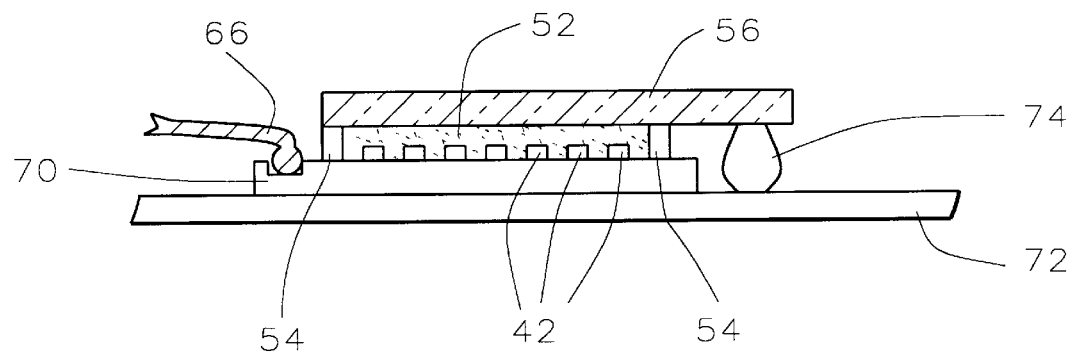

FIG. 8 illustrates a typical LCD structure. A wafer with pixels 42 thereon lies atop a printed circuit board 72. A glass plate 56 overlies the wafer supported by the LCD standoffs 54 and LCD material 52. An epoxy connection 74 is made between the glass plate and the printed circuit board 72. The wire bond 66 makes a connection between the wafer 70 and another printed circuit board, not shown.

The process of the present invention provides a simple and effective method for fabricating pixels and bonding pads where each has an optimal thickness. The pixel metal thickness is between about 1000 and 2000 Angstroms. This provides a thin highly reflective plate required for peak LCD performance and eliminates LCD cross-talk. The bonding pad contact, fabricated after the pixels are fabricated, is a thick metal layer, on the order of 5000 to 6000 Angstroms, which is sufficient for good bondability.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing semiconductor device structures in and on a semiconductor substrate wherein said semiconductor device structures are covered by an insulating layer;

depositing and patterning a first metal layer overlying said insulating layer to form a metal line and a bonding pad;

depositing a dielectric layer overlying said metal line and said bonding pad;

opening vias through said dielectric layer to said metal line but not to said bonding pad;

depositing a second metal layer overlying said dielectric layer and filling said via openings and etching back said second metal layer to form metal plugs;

depositing a third metal layer overlying said dielectric layer and said metal plugs and patterning said third metal layer to form pixels contacting said metal plugs;

depositing a passivation layer overlying said pixels;

etching a via opening through said passivation layer and said dielectric layer to said bonding pad; and forming a wire bond to contact said bonding pad to complete the fabrication of said integrated circuit device.

2. The method according to claim 1 wherein said semiconductor device structures include gate electrodes and associated source and drain regions and multiple layers of metal lines and intermetal dielectric.

3. The method according to claim 1 wherein said integrated circuit device is a liquid crystal display and further comprising:

forming a liquid crystal material layer overlying said passivation layer; and attaching a second semiconductor substrate overlying said liquid crystal material layer.

4. The method according to claim 1 wherein said second metal layer comprises tungsten.

5. The method according to claim 4 wherein said third metal layer comprises aluminum having a thickness of between about 1000 and 2000 Angstroms.

6. The method according to claim 4 wherein said third metal layer comprises an aluminum alloy having a thickness of between about 1000 and 2000 Angstroms.

7. The method according to claim 1 wherein said step of depositing said passivation layer comprises:

depositing a first conformal layer of undoped silicate glass overlying said metal lines; and depositing a second layer of silicon nitride overlying said undoped silicate glass layer.

8. The method according to claim 7 wherein said undoped silicate glass layer has a thickness of between about 500 and 1000 Angstroms.

9. The method according to claim 7 wherein said silicon nitride layer has a thickness of between about 500 and 1000 Angstroms.

10. The method according to claim 1 wherein said wire bond comprises aluminum having a thickness of between about 5000 and 6000 Angstroms.

11. A method of fabricating a liquid crystal display integrated circuit device comprising: providing semiconductor device structures in and on a semiconductor substrate wherein said semiconductor device structures are covered by an insulating layer;

depositing and patterning a first metal layer overlying said insulating layer to form a metal line and a bonding pad;

depositing a dielectric layer overlying said metal line and said bonding pad;

opening vias through said dielectric layer to said metal line but not to said bonding pad;

depositing a second metal layer overlying said dielectric layer and filling said via openings and etching back said second metal layer to form metal plugs;

depositing a third metal layer overlying said dielectric layer and said metal plugs and patterning said third metal layer to form pixels contacting said metal plugs;

depositing a passivation layer overlying said pixels;

etching a via opening through said passivation layer and said dielectric layer to said bonding pad;

forming a wire bond to contact said bonding pad;

forming a liquid crystal material layer overlying said planarized passivation layer; and attaching a second semiconductor substrate overlying said liquid crystal material layer to complete the fabrication of said liquid crystal display integrated circuit device.

12. The method according to claim 11 wherein said semiconductor device structures include gate electrodes and associated source and drain regions and multiple layers of metal lines and intermetal dielectric.

13. The method according to claim 11 wherein said second metal layer comprises tungsten.

14. The method according to claim 11 wherein said third metal layer comprises aluminum having a thickness of between about 1000 and 2000 Angstroms.

15. The method according to claim 11 wherein said third metal layer comprises an aluminum alloy having a thickness of between about 1000 and 2000 Angstroms.

16. The method according to claim 11 wherein said step of depositing said passivation layer comprises:

depositing a first conformal layer of undoped silicate glass overlying said metal lines; and depositing a second layer of silicon nitride overlying said undoped silicate glass layer.

17. The method according to claim 16 wherein said undoped silicate glass layer has a thickness of between about 500 and 1000 Angstroms.

18. The method according to claim 16 wherein said silicon nitride layer has a thickness of between about 500 and 1000 Angstroms.

19. The method according to claim 11 wherein said wire bond comprises aluminum having a thickness of between about 5000 and 6000 Angstroms.

20. A method of fabricating a liquid crystal display integrated circuit device comprising:

providing semiconductor device structures in and on a semiconductor substrate wherein said semiconductor device structures are covered by an insulating layer;

depositing and patterning a first metal layer overlying said insulating layer to form a metal line and a bonding pad;

depositing a dielectric layer overlying said metal line and said bonding pad;

opening vias through said dielectric layer to said metal line but not to said bonding pad;

forming tungsten plugs within said via openings;

depositing a first aluminum layer overlying said dielectric layer and said tungsten plugs wherein said first aluminum layer has a first thickness and patterning said first aluminum layer to form pixels contacting said tungsten plugs;

depositing a passivation layer overlying said pixels;

etching a via opening through said passivation layer and said dielectric layer to said bonding pad;

forming an aluminum wire bond to contact said bonding pad wherein said aluminum wire bond has a second thickness greater than said first thickness;

forming a liquid crystal material layer overlying said planarized passivation layer; and attaching a second semiconductor substrate overlying said liquid crystal material layer to complete the fabrication of said liquid crystal display integrated circuit device.

21. The method according to claim 20 wherein said first thickness is between about 1000 and 2000 Angstroms and said second thickness is between about 5000 and 6000 Angstroms.

* * * * *